United States Patent
Nittala et al.

(10) Patent No.: US 11,170,990 B2
(45) Date of Patent: Nov. 9, 2021

(54) POLYSILICON LINERS

(71) Applicant: Applied Materials, Inc., Santa Clara, CA (US)

(72) Inventors: Krishna Nittala, Sunnyvale, CA (US); Rui Cheng, Santa Clara, CA (US); Karthik Janakiraman, San Jose, CA (US); Praket Prakash Jha, San Jose, CA (US); Jinrui Guo, Santa Clara, CA (US); Jingmei Liang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/795,191

(22) Filed: Feb. 19, 2020

(65) Prior Publication Data

US 2020/0266052 A1  Aug. 20, 2020

Related U.S. Application Data

(60) Provisional application No. 62/807,614, filed on Feb. 19, 2019.

(51) Int. Cl.
*H01L 21/02* (2006.01)

(52) U.S. Cl.
CPC .... *H01L 21/02164* (2013.01); *H01L 21/0262* (2013.01); *H01L 21/02532* (2013.01); *H01L 21/02576* (2013.01); *H01L 21/02592* (2013.01); *H01L 21/02595* (2013.01)

(58) Field of Classification Search
CPC ............. H01L 24/72; H01L 25/071; H01L 2924/10254; H01L 2924/10272; H01L 2924/1033; H01L 2924/1203; H01L 2924/13055
See application file for complete search history.

(56) References Cited

U.S. PATENT DOCUMENTS

| | | | | |
|---|---|---|---|---|
| 5,326,722 A | * | 7/1994 | Huang | H01L 21/28525 257/E21.166 |
| 5,728,610 A | | 3/1998 | Gosain et al. | |
| 5,882,962 A | * | 3/1999 | Tseng | H01L 21/823468 438/197 |
| 5,885,889 A | * | 3/1999 | Aisou | H01L 27/10852 438/592 |

(Continued)

FOREIGN PATENT DOCUMENTS

| KR | 101414849 B1 | 7/2014 |
|---|---|---|
| KR | 20160083049 A | 7/2016 |

OTHER PUBLICATIONS

International Search Report dated Jun. 16, 2020 for Application No. PCT/US2020/018854.

*Primary Examiner* — Zandrav V Smith
*Assistant Examiner* — Andre C Stevenson
(74) *Attorney, Agent, or Firm* — Patterson + Sheridan LLP

(57) ABSTRACT

Aspects of the disclosure provide a method including depositing an underlayer comprising silicon oxide over a substrate, depositing a polysilicon liner on the underlayer, and depositing an amorphous silicon layer on the polysilicon liner. Aspects of the disclosure provide a device intermediate including a substrate, an underlayer comprising silicon oxide formed over the substrate, a polysilicon liner disposed on the underlayer, and an amorphous silicon layer disposed on the polysilicon liner.

11 Claims, 3 Drawing Sheets

(56) References Cited

U.S. PATENT DOCUMENTS

| | | | | |
|---|---|---|---|---|
| 5,904,564 A | * | 5/1999 | Park | H01L 21/28052 |
| | | | | 438/683 |
| 5,976,959 A | * | 11/1999 | Huang | H01L 21/76294 |
| | | | | 257/E21.567 |
| 6,482,749 B1 | * | 11/2002 | Billington | C11D 7/06 |
| | | | | 257/E21.214 |
| 7,563,659 B2 | | 7/2009 | Kwon et al. | |
| 8,088,688 B1 | | 1/2012 | Herner | |
| 8,198,144 B2 | | 6/2012 | Herner | |
| 2001/0047764 A1 | * | 12/2001 | Cook | C23C 16/4412 |
| | | | | 118/730 |
| 2003/0142705 A1 | * | 7/2003 | Hackel | H01S 3/2341 |
| | | | | 372/22 |
| 2012/0289046 A1 | * | 11/2012 | Ko | H01L 21/76883 |
| | | | | 438/675 |
| 2013/0292627 A1 | * | 11/2013 | Sonehara | H01L 27/226 |
| | | | | 257/2 |
| 2019/0237540 A1 | * | 8/2019 | Gao | H01L 23/585 |

\* cited by examiner

POLYSILICON LINERS

CROSS-REFERENCE TO RELATED APPLICATIONS

This application claims benefit of U.S. provisional patent application Ser. No. 62/807,614, filed Feb. 19, 2019, which is herein incorporated by reference.

BACKGROUND

Field

Embodiments of the present disclosure generally relate to formation of polysilicon liners, for example, in the fabrication of semiconductor devices.

Description of the Related Art

In the formation of some semiconductor devices, multiple films are deposited in one another in a stack. The films are then further post-processed, for example, by one or more of etching, polishing, patterning, annealing, and the like. Depending on the particular post processing and the composition of the film stock, diffusion of species can occur within films and/or across film boundaries.

One example of species diffusion includes the diffusion of hydrogen within films and across film boundaries. Differing rates of diffusion through different film compositions results in the accumulation of hydrogen at film interfaces. As the hydrogen accumulates, bubbles form at the interface, which reduces adhesion of the films to one another, and may lead to delamination of the films from one another.

Therefore, there is a need in the art for improving film adhesion.

SUMMARY

Embodiments of the present disclosure generally relate to formation of polysilicon liners, for example, in the fabrication of semiconductor devices.

In one embodiment, a method includes depositing an underlayer comprising silicon oxide over a substrate, depositing a polysilicon liner on the underlayer, and depositing an amorphous silicon layer on the polysilicon liner.

In one embodiment, a device intermediate including a substrate having an underlayer comprising silicon oxide formed over the substrate, a polysilicon liner disposed on the underlayer, and an amorphous silicon layer disposed on the polysilicon liner.

In one embodiment, a method of forming a device intermediate including depositing an underlayer comprising silicon oxide over a substrate, depositing a polysilicon liner on the underlayer, the depositing of the polysilicon liner is performed in the same chamber as the depositing of the underlayer, and depositing an amorphous silicon layer on the polysilicon liner.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to formation of polysilicon liners, for example, in the fabrication of semiconductor devices. Embodiments of the present disclosure also relates to devices (and device intermediates) including polysilicon liners.

Figure 1:
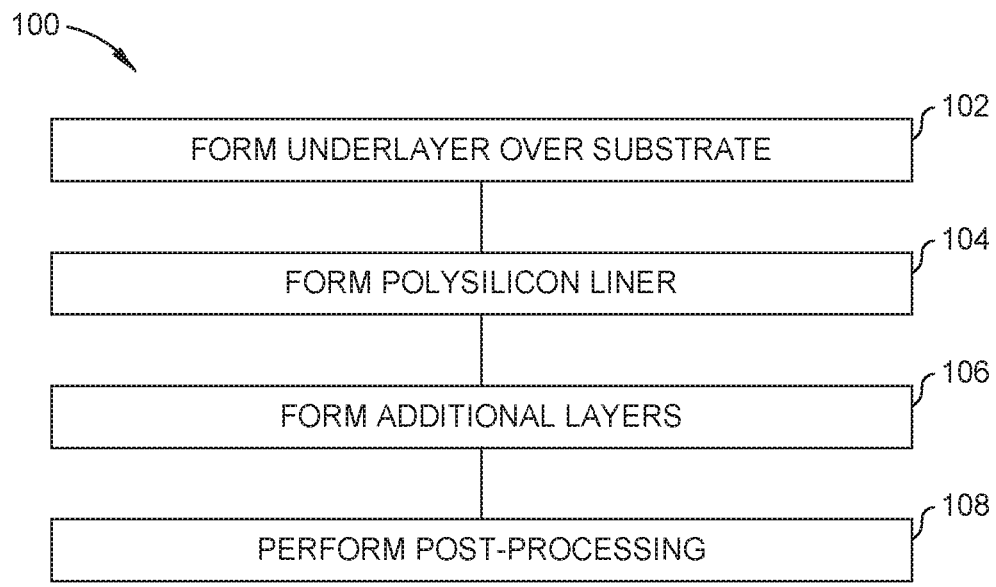
FIG. 1 is a flow diagram of a method of processing a substrate, according to one embodiment of the disclosure.

FIG. 1 is a flow diagram of a method 100 of processing a substrate, according to one embodiment of the disclosure. Method 100 begins at operation 102. In operation 102, one or more underlayers are formed on the substrate. The substrate may be, for example, any substrate or material surface formed on a substrate upon which film processing is performed during a fabrication process. For example, a substrate surface on which processing can be performed include materials such as silicon, silicon oxide, strained silicon, silicon on insulator (SOI), highly doped silicon, carbon doped silicon oxides, amorphous silicon, doped silicon, germanium, gallium arsenide, glass, sapphire, and any other materials such as metals, metal nitrides, metal alloys, and other conductive materials and combinations, for example, including an alternating or patterned scheme of metal and oxide, depending on the application. Highly doped silicon may include silicon doped with boron or phosphorus at doping levels of about 0.1% and higher. Substrates include, without limitation, semiconductor wafers.

The one or more underlayers may include, for example, silicon oxide. In one example, an underlayer of silicon oxide has an amorphous structure. The underlayer is formed to a thickness of about 100 angstroms to about 2000 angstroms, such as about 200 angstroms to about 1000 angstroms, or such as about 300 angstroms to about 500 angstroms. However, other thicknesses are also contemplated.

The one or more underlayers may be formed using thermal chemical vapor deposition (CVD), thermal atomic layer deposition (ALD), plasma enhanced chemical vapor deposition (PECVD), or plasma enhanced atomic layer deposition (PEALD). One example of a suitable processing chamber includes the Precision™ PECVD processing chamber available from Applied Materials, Inc., of Santa Clara, Calif. It is contemplated that other processing chambers, including those from other manufacturers, may also be used.

Subsequently, in operation 104, a polysilicon liner is formed on an upper surface of the one or more underlayers. The polysilicon liner has a crystallinity of about 1 percent to about 100 percent, such as about 10 percent to about 90 percent, or about 20 percent to about 80 percent, or about 20 percent to about 70 percent, or about 20 percent to about 60 percent, or about 20 percent to about 50 percent, or about 25 percent to about 40 percent, or about 25 percent to about 35 percent.

In one example, the polysilicon liner is formed during a PECVD process. The PECVD process utilizes one or more of a capacitively coupled plasma, an inductively coupled plasma, microwave plasma, or a remote plasma to facilitate deposition of the polysilicon liner on an upper surface of the one or more underlayers. The polysilicon liner is formed to a thickness within a range of about 10 angstroms to about 500 angstroms, such as about 10 angstroms to about 200 angstroms, or about 20 angstroms to about 50 angstroms. The polysilicon liner may be formed in the same processing chamber as the one or more underlayers, or the polysilicon liner may be formed in a different chamber than the one or more underlayers.

During formation of the polysilicon liner, one or more process gases are introduced to the processing chamber, and radicals thereof are generated via plasma excitation. The one or more process gases include a silicon source, as well as an optional reducing agent and an optional carrier gas or one inert gas. In such an example, the process gases include silane or higher order silanes (e.g., $Si_nH_{2n+2}$; where n is an integer of 1 or greater). The process gas may also include hydrogen, such as diatomic hydrogen, and a carrier gas of helium, argon, or the like. The silane is provided to an internal volume of the processing chamber at a flow rate within a range of about 10 sccm to about 38 sccm, such as about 15 sccm to about 30 sccm, for a 300 millimeter (mm) substrate. The hydrogen is provided to the interior volume of the processing chamber at a flow rate within a range of about 500 sccm to about 3500 sccm, or about 1000 sccm to about 1500 sccm for a 300 mm substrate. A carrier gas may be provided a flow rate of about 0 sccm to about 1000 sccm, such as about 50 sccm to about 600 sccm, or about 200 sccm to about 300 sccm. High frequency RF power of about 300 watts to about 2700 watts, such as about 1000 watts to about 1500 watts, is applied to the process gas to generate radicals of the process gas.

During the deposition of the polysilicon liner, the pressure within the chamber is maintained within a range of about 0.5 Torr about 10 Torr, such as about 1 Torr to about 5 Torr. The substrate is maintained at temperature of about 300 degrees Celsius to about 500 degrees Celsius, for example, about 350 degrees Celsius to about 450 degrees Celsius, during the deposition. The deposition process may last for a time period sufficient to deposit a polysilicon liner of predetermined thickness. For example, the deposition time may last for about 30 seconds to about 1800 seconds, such as about 60 seconds to about 180 seconds.

In another example, the polysilicon liner is formed during a thermal deposition process, such as thermal CVD. The polysilicon liner is formed to a thickness within a range of about 50 angstroms to about 200 angstroms. Deposition occurs at a temperature of about 350 degrees Celsius to about 650 degrees Celsius, for example between about 500 degrees Celsius and 650 degrees Celsius, and for a time period sufficient to deposit the polysilicon liner to a predetermined thickness. Precursors similar to those discussed above may also be utilized in a thermal CVD operation.

In another example, the polysilicon liner is formed by deposition of an amorphous silicon layer during a PECVD process or a thermal deposition process, such as thermal CVD, followed by a crystallization anneal process. The amorphous silicon layer may be deposited using process conditions similar to those discussed above. The amorphous silicon layer may be formed by using a process gas including one or more silicon precursors such as silane, a carrier gas and a reducing agent. The amorphous silicon layer may be low hydrogen amorphous silicon, for example, less than 1 percent amorphous silicon. The amorphous silicon layer is formed to a thickness within a range of about 10 angstroms to about 1000 angstroms such as about 10 angstroms to about 500 angstroms, or about 50 angstroms to about 100 angstroms. The amorphous silicon layer is further processed using a crystallization anneal. The crystallization anneal process may be a thermal anneal at temperature of about 600 degrees Celsius to about 650 degrees Celsius for a time period of between 1 hour and 4 hours, such as about 1 hour to 2 hours. In another example, the crystallization anneal process may be a spiked anneal processes using a rapid thermal anneal process chamber. The spiked anneal process may be at a temperature of about 900 degrees Celsius to about 1100 degrees Celsius, such as 1000 degrees Celsius for a period of time of about 1 second to about 5 seconds. The anneal process strengthens the adhesion of the polysilicon liner to the upper surface of the underlayers formed in operation 102.

In operation 106, one or more additional layers are formed on the upper surface of the polysilicon liner. The one or more additional layers may include, for example, doped or undoped amorphous silicon. In a specific example, the one or more additional layers include alternating layers of n-doped (e.g., phosphorus) and undoped amorphous silicon in a stack. In another example, the one or more additional layers include alternating layers of p-doped (e.g., boron) and undoped amorphous silicon in a stack. In another example, the one or more additional layers is a single layer of p-doped or n-doped amorphous silicon. The one or more additional layers may be formed in a PECVD chamber, using a process gas including one or more a silicon precursor such as a silane, a carrier gas, a reducing agent, and a dopant, such as n-type dopant like phosphine. The one or more additional layers facilitate the formation of semiconductor devices, such as a memory device, through one or more post processing operations. The one or more additional layers may be formed in the same processing chamber as the polysilicon liner, or in a different processing chambering.

In operation 108, one or more post processes are performed on the substrate having the underlayers, polysilicon liner, and one or more additional layers thereon (also referred to herein as a device intermediate). Post processing operations include further deposition processes, etching processes, masking, etching, lithography, doping, thermal treatment, and polishing, among others. In one particular example, the device intermediate having deposited layers thereon is subject to a thermal treatment process, such as annealing. The thermal annealing process facilitates repair of film defects within the device intermediate, as well as facilitating even distribution of dopant species within respective layers.

While FIG. 1 describes one method of processing a substrate, other embodiments are also contemplated. For example, it is contemplated a native oxide removal process, or another cleaning process, may occur before operation 102. In such an example, the native oxide removal process or other cleaning process may occur in the same chamber as operation 102 and/or 104 and/or 106, or with in a different chamber than operation 102 and/or 104 and/or 106. In another example, which can be combined with other examples and embodiments herein, the one or more additional layers of operation 106 may be formed via a thermal deposition process, rather than by PECVD.

Figure 2:
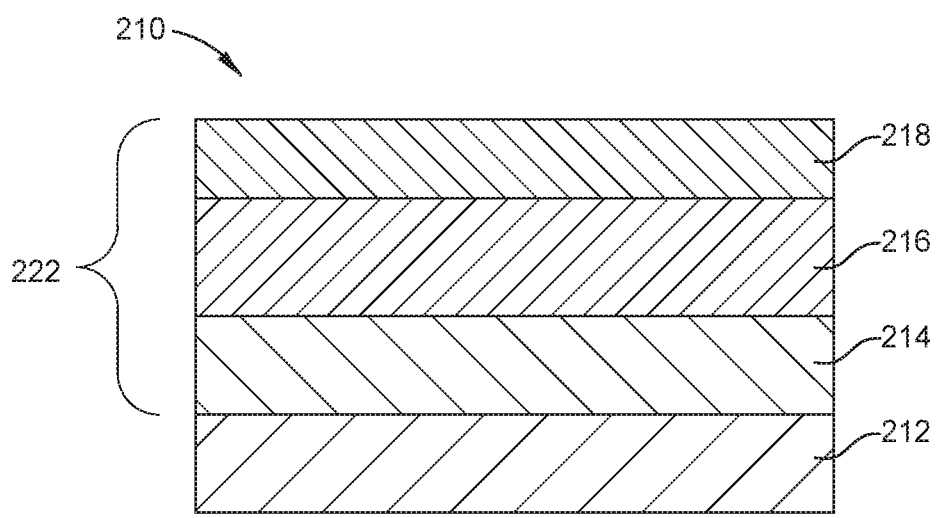
FIG. 2 is a schematic sectional view of a device intermediate formed according to the method of FIG. 1.

FIG. 2 is a schematic sectional view of a device intermediate 210 formed according to method 100 of FIG. 1. A device intermediate as used herein refers to a device during fabrication, e.g., a device prior to completion of fabrication. The device intermediate 210 includes a substrate 212 and intermediate stack 222. Intermediate stack 222 includes, one or more underlayers 214 (one is shown for clarity) formed over the substrate 212. The intermediate stack 222 also includes a polysilicon liner 216 formed on the one or more underlayers 214, as well as one or more amorphous silicon layers 218 (one is shown for clarity) formed on the polysilicon liner 216. It is contemplated that the device intermediate 210 may include other features not shown here for clarity.

During processing of the substrate, including during post processing of the device intermediate 210 (i.e., operation 108) and/or during formation of the one or more additional layers 218 (i.e., operation 106), hydrogen diffuses within deposited films as well as across film boundaries. The hydrogen is induced to diffuse due to one or more mechanisms, including (1) a relatively higher hydrogen concentration in the amorphous silicon layers of the one or more additional layers 218 versus the hydrogen concentration in the silicon oxide in the one or more underlayers 214, and (2) elevated temperatures during processing and/or post processing. One or both of the relatively greater hydrogen concentration of amorphous silicon and elevated temperatures facilitates migration of hydrogen from the amorphous silicon of the one or more additional layers 218 towards the silicon of the one or more underlayers 214. Due to a higher rate of diffusion of hydrogen through amorphous silicon (e.g., the one or more additional layers 218) as compared to silicon (e.g., the one or more underlayers 214), hydrogen has a tendency to accumulate at the interface of the silicon and the amorphous silicon in conventional device structures. Such accumulation results in hydrogen bubbles forming at the amorphous silicon-silicon interface, resulting in reduced adhesion or delamination of the amorphous silicon (e.g., the one or more additional layers) from the silicon (e.g., the one or more underlayers) in conventional structures which do not include a polysilicon liner 216.

In contrast to conventional approaches (which deposit the amorphous silicon of the one or more additional layers directly on the silicon of the one of the one or more underlayers), aspects of the present disclosure include a polysilicon liner 216 disposed on the one or more underlayers 214. The polysilicon liner 216 prevents hydrogen from diffusing from the one or more additional layers to the upper surface of the one or more underlayers 214. Thus, hydrogen does not accumulate at the upper surface of the one or more underlayers 214, and gas bubble formation at the upper surface of the one or more underlayers 214 is mitigated or prevented. Because the formation of hydrogen gas bubbles at the upper surface of the one or more underlayers 214 is mitigated or prevented, adhesion of the film stack is improved.

It is to be noted that even if hydrogen diffuses to the interface of the one or more additional layers 218 and the polysilicon liner 216, adhesion is generally not decreased to a level at which delamination occurs. This is due, at least in part, to the relatively high adhesion between amorphous silicon and polysilicon. Thus, in examples described herein, hydrogen accumulates at a relatively stronger adhesive interface (e.g., between amorphous silicon and the polysilicon) rather than at a relatively weaker adhesive interface (e.g., between amorphous silicon and silicon oxide).

The device intermediate as described above in reference to FIG. 2 can be used in various portions of device structures such as a select bit transistor used in in memory device such as a metal-oxide-silicon field-effect transmitter (MOSFET) device. In other examples, the method for forming the device intermediate in Reference to FIG. 1 and FIG. 2 may be beneficial to form device intermediate structures that are part of device structures such as memory device structures including magnetic randon-access memory (MRAM), spin-tansfer torque random-access memory (STT-RAM), ferroelectric random-access memory (FeRAM) and phase-change memory (PCM).

Figure 3A:
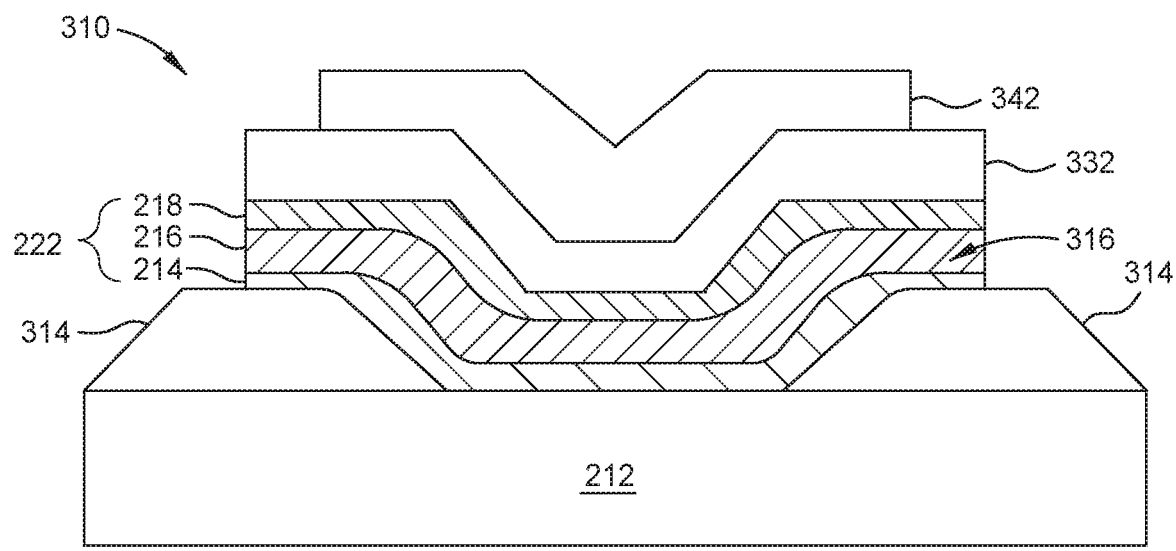
FIG. 3A is a schematic sectional view of a device structure that includes the device intermediate of FIG. 2.

FIG. 3A is a schematic sectional view that illustrates one example of a thin-film transistor (TFT) device structure 310. Device structure 310 includes a channel 316 that includes the device intermediate 210 and intermediate stack 222, including silicon underlayer 214, polysilicon liner 216 and amorphous silicon layer 218 described above with regard to FIG. 2. The device structure 310 includes substrate 212 (e.g., glass, silicon), metal contacts 314, and channel 316 over the substrate 212 and metal contacts 314. An insulator layer 332 (e.g., silicon oxide layer) is deposited on the channel 316 and a gate metal layer 342 is deposited on the insulator layer 332.

Figure 3B:
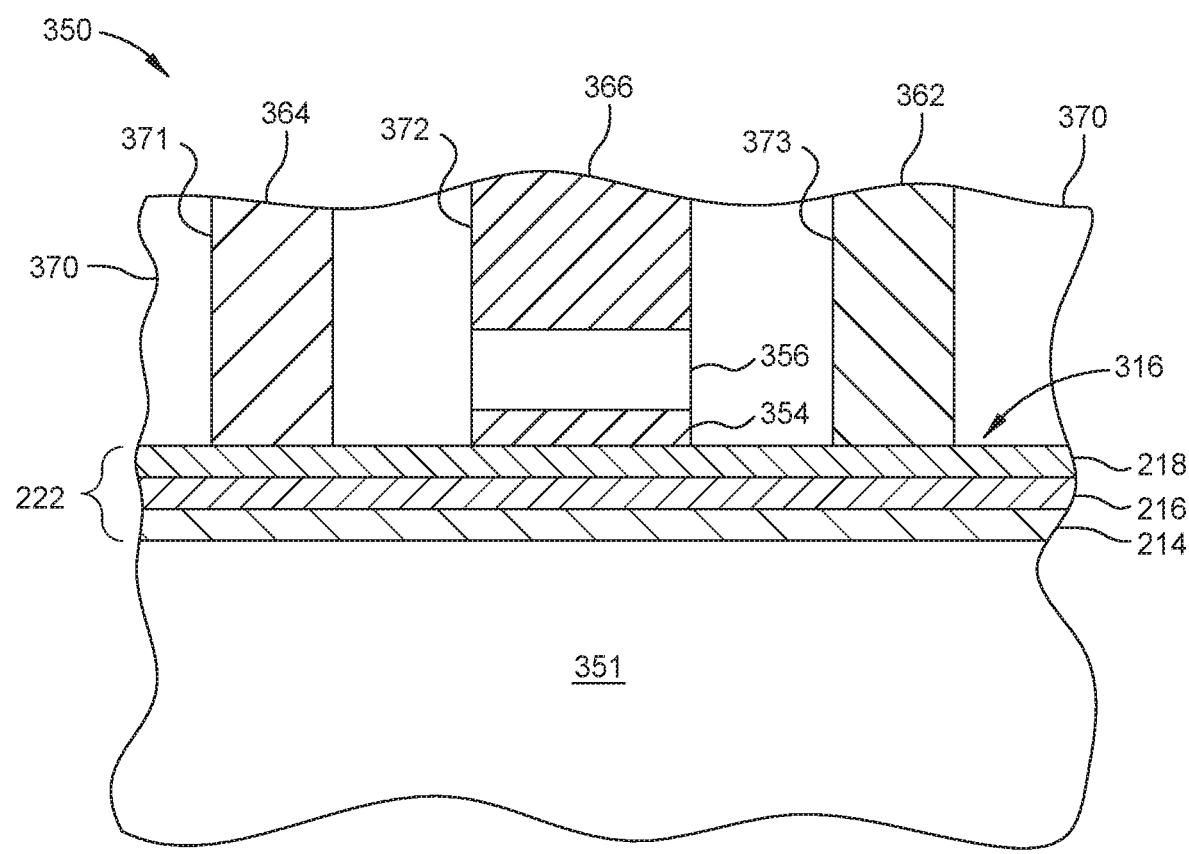
FIG. 3B is a schematic sectional view of another device structure that includes the device intermediate of FIG. 2.

FIG. 3B is a schematic sectional view that illustrates one example of device structure 350. Device structure 350 may form part of a MRAM device, PCM device, FeRAM device or other semiconductor device. Device structure 350 includes channel 316 that includes the device intermediate 210 and intermediate stack 222, including silicon underlayer 214, polysilicon liner 216 and amorphous silicon layer 218 described above with regards to FIG. 2. The device structure 350 includes substrate 351 (e.g., silicon, germanium) and channel 316. Device structure 350 further includes a field oxide 370 formed over the intermediate stack 222. A source contact 364 is formed in via 371. A via 372 includes a gate metal layer 356 and an interconnect 366. The insulator layer 354 (e.g., silicon oxide) is disposed between gate metal layer 356 and the intermediate stack 222. A drain contact 362 is formed in via 373.

Figure 4:
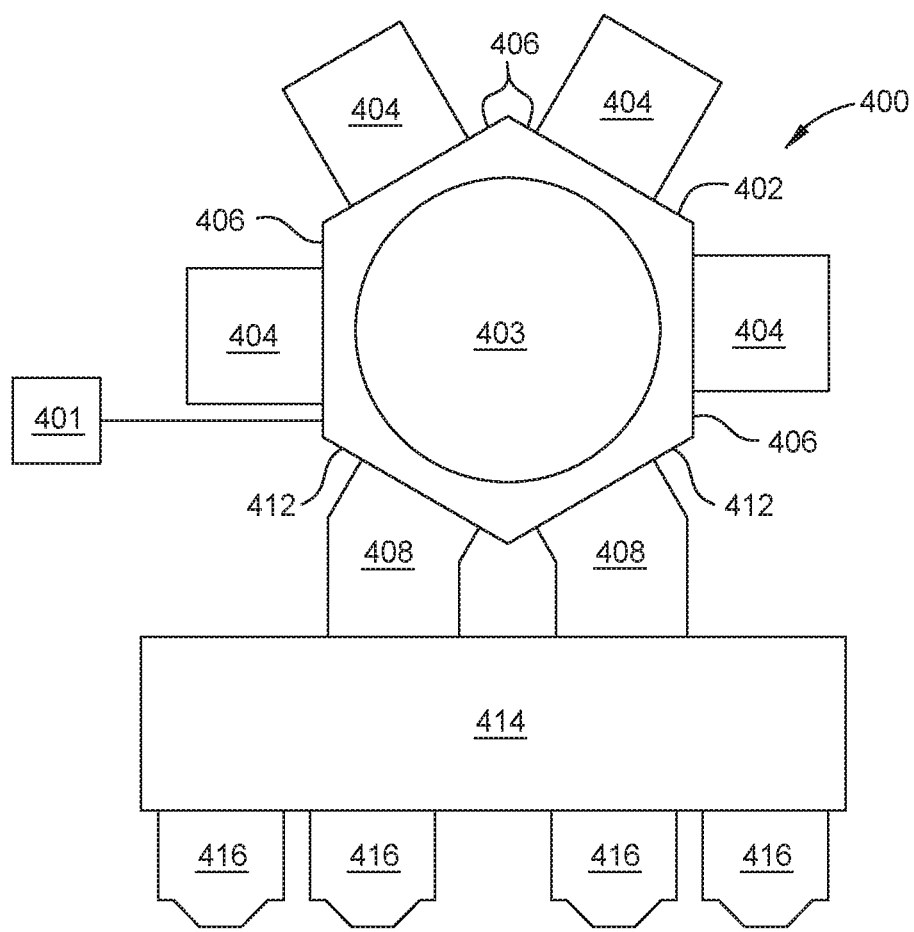
FIG. 4 is a top view of a schematic of a vacuum processing system that can be used perform the method of forming a device intermediate of FIG. 2 according to the method of FIG. 1.

FIG. 4 illustrates a schematic top view of an exemplary vacuum processing system 400 where the method of forming the device structure, as described herein, may be performed. This system 400 is of the cluster type of systems used for manufacturing processed substrates in a vacuum such as integrated circuits on wafers. The vacuum processing system 400 includes a transfer chamber 402 typically mounted on a platform (not shown). The transfer chamber is connected to a system controller 401, the system controller 401 is configured to store and/or implement aspects of the subject matter disclosed herein. The transfer chamber 402 has a lid 403 mounted on its top. When the lid 403 is attached, the lid 403 forms an airtight seal with the transfer chamber 402, so that when the pressure in the transfer chamber is reduced to a vacuum, air does not leak into the transfer chamber 402. The transfer chamber 402 has process chambers 404 attached at facets 406. Process chambers 404 may be any type of process chamber, such as a physical vapor deposition chamber, a CVD chamber, an ALD chamber, a PECVD chamber, a PEALD chamber, an etch chamber, etc. The process chambers 404 may be supported by the transfer chamber 402 or may be supported on their own platforms depending on the configuration of the individual process chambers 404. Slit valves (not shown) in the facets 406 provide access and isolation between the transfer chamber 402 and the process chambers 404. Correspondingly, the process chambers 404 have openings (not shown) on their surfaces that align with the slit valves. The transfer chamber 402 also has load lock chambers 408 mounted at facets 412. Openings (not shown) in the facets 412 provide access and isolation between the load lock chambers 408 and the transfer chamber 402. Correspondingly, the load lock chambers 408 have openings on their surfaces that align with the openings in facets 412.

The load lock chambers 408 are attached to a mini-environment 414. The load lock chambers 408 and the mini-environment 414 have corresponding openings (not shown) providing access between load lock chambers and the mini-environment, while doors (not shown) for the openings provide isolation. The mini-environment 414 has pod loaders 416 attached on its front side. Openings (not shown) with corresponding doors (not shown) provide access and isolation between the mini-environment 414 and the pod loaders 416.

In operation, the substrate to be processed in the system 400 are placed on the top of the pod loaders 416. Then a robot (not shown) begins removing the substrate, one at a time, out of the pod loaders 416 and into one of the load lock chambers 408. After the substrates have been loaded into the load lock chamber 408, the pressure in the load lock chamber is reduced to match that in the transfer chamber 402. Then the door on the transfer chamber side is opened, and the transfer chamber robot (not shown) can begin servicing the load lock chamber 408. The transfer chamber robot moves the substrates from the load lock chamber 408 to one of the process chambers 404 for processing, and afterwards moves the substrates back to one of the load lock chambers 408. When the load lock chamber 408 has received all of the processed substrates, the pressure in the load lock chamber is returned to that of the mini-environment, so the robot within the mini-environment can move the processed substrates back to a substrate pod loader 416.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
   depositing an underlayer comprising silicon oxide over a substrate;
   depositing a polysilicon liner on the underlayer, by providing a silicon source to the substrate at a flow rate within a range of about 10 sccm to about 38 sccm for a time period of between 30 seconds and 1800 seconds at a temperature of between about 300 degrees Celsius to about 500 degrees Celsius until the polysilicon liner has a crystallinity of between about 25 percent to about 40 percent; and
   depositing an amorphous silicon layer on the polysilicon liner.

2. The method of claim 1, further comprising thermal treatment subsequent to the depositing of the amorphous silicon layer.

3. The method of claim 2, wherein the thermal treatment is an annealing process.

4. The method of claim 1, further comprising thermal treatment subsequent to the depositing of the polysilicon liner and before the depositing of the amorphous silicon layer.

5. The method of claim 4, wherein the thermal treatment is a crystallization thermal anneal process of between about 600 degrees Celsius and 650 degrees Celsius for a time period between 1 to 2 hours.

6. The method of claim 4, wherein the thermal treatment is a crystallization spike anneal process of between about 900 degrees Celsius and 1,100 degrees Celsius for a time period between about 1 second to about 5 seconds.

7. The method of claim 1, wherein the underlayer comprising silicon oxide has an amorphous structure.

8. The method of claim 1, wherein the polysilicon liner has a crystallinity of between about 25 percent to about 40 percent.

9. The method of claim 1, wherein the polysilicon liner is formed in the same chamber as the underlayer.

10. The method of claim 1, wherein the polysilicon liner is formed using a thermal CVD process at a temperature of between about 350 degrees Celsius to about 500 degrees Celsius.

11. A method of forming a device intermediate, the method comprising:
    depositing an underlayer comprising silicon oxide over a substrate;
    depositing a polysilicon liner on the underlayer, by providing a silicon source to the substrate at a flow rate within a range of about 10 sccm to about 38 sccm for a time period of between 30 seconds and 1800 seconds at a temperature of between about 300 degrees Celsius to about 500 degrees Celsius until the polysilicon liner has a crystallinity of between about 25 percent to about 40 percent, wherein the depositing of the polysilicon liner is performed in the same chamber as the depositing of the underlayer; and
    depositing an amorphous silicon layer on the polysilicon liner.

* * * * *